United States Patent
Yokoi et al.

(10) Patent No.: US 9,398,371 B2
(45) Date of Patent: Jul. 19, 2016

(54) ANALOG SIGNAL TRANSFER SYSTEM, VARIABLE COMPRESSOR, AND VARIABLE EXPANDER

(71) Applicants: Osamu Yokoi, Tokyo (JP); Yuki Abe, Tokyo (JP)

(72) Inventors: Osamu Yokoi, Tokyo (JP); Yuki Abe, Tokyo (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 806 days.

(21) Appl. No.: 13/688,362

(22) Filed: Nov. 29, 2012

(65) Prior Publication Data

US 2013/0151261 A1 Jun. 13, 2013

(30) Foreign Application Priority Data

Dec. 8, 2011 (JP) ................................ 2011-268828

(51) Int. Cl.
- H03G 7/00 (2006.01)
- H04R 3/00 (2006.01)
- H03G 9/02 (2006.01)
- H04B 1/64 (2006.01)

(52) U.S. Cl.
CPC .................. H04R 3/00 (2013.01); H03G 7/002 (2013.01); H03G 9/025 (2013.01); H04B 1/64 (2013.01)

(58) Field of Classification Search
CPC ............ H04R 3/00; H04B 1/64; H03G 9/025; H03G 7/002; H03G 7/007; H03G 9/005; H03G 7/06
USPC .................... 381/106, 104, 98; 704/500, 503; 455/72, 43, 42
See application file for complete search history.

(56) References Cited

U.S. PATENT DOCUMENTS

| 2,118,175 | A |   | 5/1938 | Doba, Jr. | |
|---|---|---|---|---|---|
| 3,846,719 | A | * | 11/1974 | Dolby | H03G 9/18 330/126 |
| 3,972,010 | A | * | 7/1976 | Dolby | H04B 1/64 333/14 |
| 4,224,581 | A | * | 9/1980 | Watanabe | H03G 9/025 327/306 |
| 5,185,806 | A | * | 2/1993 | Dolby | H03G 9/005 333/14 |
| 2003/0063024 | A1 | * | 4/2003 | Cerra | H04B 1/64 341/155 |

FOREIGN PATENT DOCUMENTS

| JP | 55121750 | 9/1980 |
|---|---|---|
| JP | 58157210 | 9/1983 |
| JP | 2002271481 A | 9/2002 |
| WO | WO 03/030387 | 4/2003 |

OTHER PUBLICATIONS

"Software Tools for Speech and Audio Coding Standardization; G. 191 STL-2005 Manual (Aug. 2005)" ITU-T Standard, International Telecommunication Union, Aug. 1, 2005, p. 85-88.

* cited by examiner

Primary Examiner — Vivian Chin
Assistant Examiner — Con P Tran
(74) Attorney, Agent, or Firm — Whitham, Curtis & Cook, PC.

(57) ABSTRACT

An analog signal transfer system includes a transmission apparatus including a variable compressor that variably compresses input signals exponentially according to the amplitudes of the input signals; and a reception apparatus including a variable expander that variably expands the compressed signals exponentially according to the amplitudes of the compressed signals.

10 Claims, 7 Drawing Sheets

ANALOG SIGNAL TRANSFER SYSTEM, VARIABLE COMPRESSOR, AND VARIABLE EXPANDER

TECHNICAL FIELD

The present invention relates to an analog signal transfer system, a variable compressor, and a variable expander and is applicable to, for example, a wireless microphone system.

BACKGROUND ART

An example analog signal transfer system is an audio signal transfer system such as a wireless microphone system. In a wireless microphone system, companding is carried out to reduce inflow of noise from a noise source through a wireless transfer path.

Companding is a portmanteau word of "compressing" and "expanding". In detail, companding represents compression and expansion of the dynamic range of electric signals.

A circuit or element compressing signals is called a compressor. A circuit or element expanding signals is called an expander. A combination of a compressor and an expander is called a compander. Companding can be carried out to transfer signals having wide dynamic ranges through an apparatus or line having only a narrow dynamic range for transferring and reduce noise in received signals.

A transfer path for electric signals is exposed, for example, to interference radio waves from an adjacent signal source and to noise emitted from a circuit of a transmitter or receiver in a signal transfer system. A transfer path for signals has a limit of its dynamic range and is therefore susceptible to noise flowing thereinto. Companding is effective in a reduction in noise in such a signal transfer path. For example, if an encoder in a transmitter compresses a dynamic range into ½ through a logarithmic compression circuit having a ratio of 1:2, a decoder having a ratio of 2:1 in a receiver conversely expands the dynamic range into double.

Companding having a high expansion ratio corresponding to a high compression ratio leads to a variation in noise level in synchronization with a variation in signal level. In a wireless microphone system, this variation in noise level is called breathing. A variation in the level of compressed and expanded signals leads to a continuous variation in noise level. This amplitude-modulates the noise. Even amplitude-modulated noise having a low level is audible much more uncomfortably than continuous noise having a constant level. This sounds like breathing in background of audio signals such as music. This sound like breathing is called "breathing" or "breathing noise". Dynamic noise having a correlation with audio signals such as breathing noise is significantly uncomfortable for a listener and causes significant deterioration of the sound quality.

In a well-known wireless audio noise reduction system including a compander disclosed in Patent Publication WO2003/030387, a variable compressor compresses signals exceeding a first predetermined input threshold value at a higher compression ratio than 1:1, and a variable expander expands signals exceeding a second predetermined input threshold value at a higher expansion ratio than 1:1.

The invention disclosed in Patent Publication WO2003/030387 switches the compression ratio and the expansion ratio each between two levels depending on whether a signal level exceeds the predetermined threshold value, and thereby reduces breathing noise. Unfortunately, this invention causes noise or abnormal sound at a bent point as a boundary at which the compression ratio and the expansion ratio are each switched between the two levels.

SUMMARY OF INVENTION

Technical Problem

It is an object of the present invention to solve the above problem in conventional techniques, i.e., effectively reduce breathing noise without causing noise or abnormal sound in an analog signal transfer system including a so-called compander.

It is another object of the present invention to provide a variable compressor and a variable expander suitable for the analog signal transfer system.

Solution to Problem

According to the present invention, an analog signal transfer system includes:

a transmission apparatus including a variable compressor that variably compresses input signals exponentially according to the amplitudes of the input signals and generates compressed signals; and a reception apparatus that includes a variable expander that variably expands the compressed signals exponentially according to the amplitudes of the compressed signals and generates expanded signals.

DESCRIPTION OF EMBODIMENTS

Figure 1:
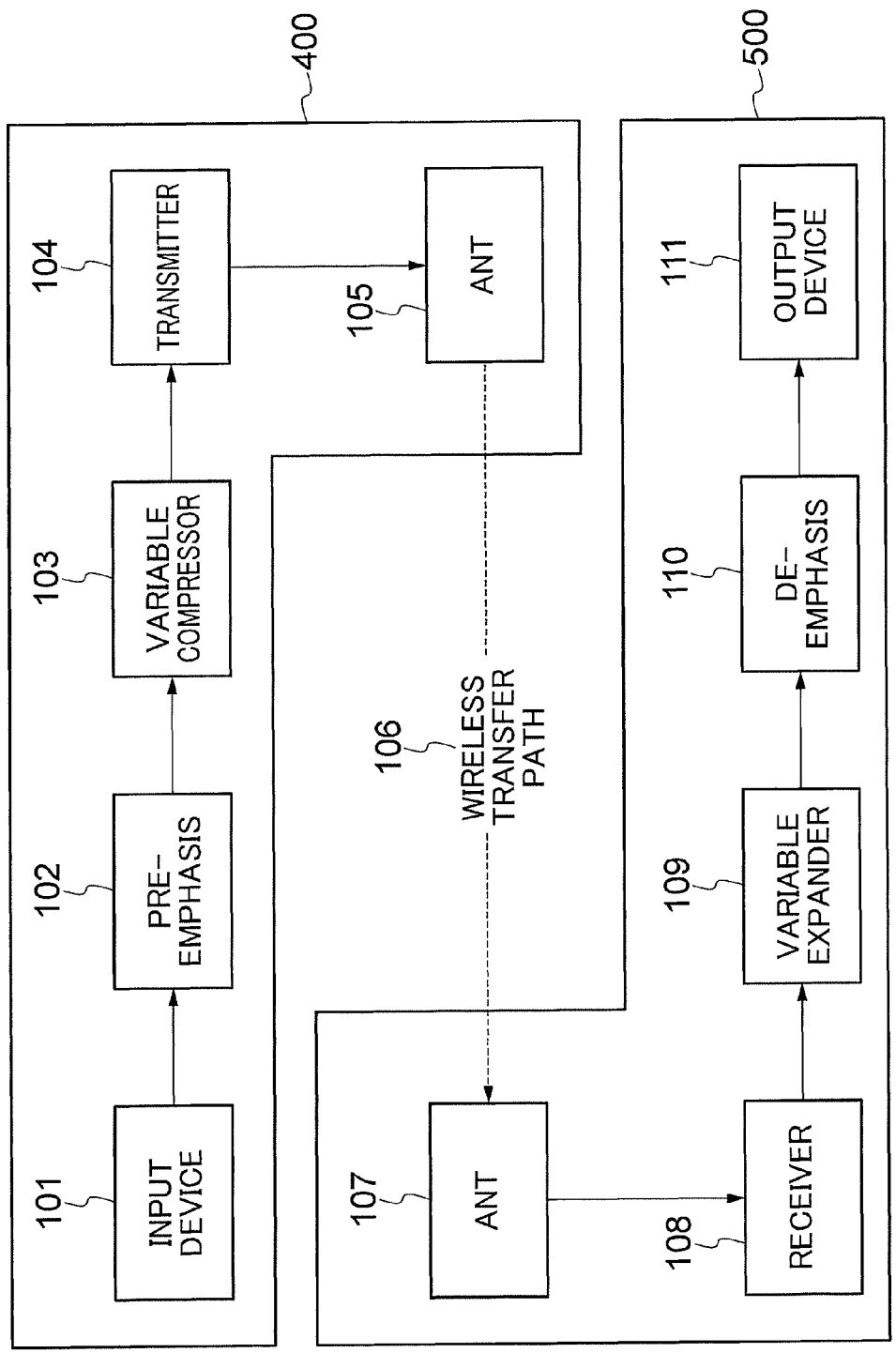
FIG. 1 is a block diagram illustrating an analog signal transfer system according to an embodiment of the present invention.

An analog signal transfer system, a variable compressor, and a variable expander according to an embodiment of the present invention will now be described with reference to the accompanying drawings.

The present invention enables an effective reduction in breathing noise using a variable compressor and a variable expander for dynamic range. When receiving signals having large amplitudes, the variable compressor compresses the signals at a high compression ratio. If reproduced sound of audio signals having large amplitudes includes a certain high level of dynamic noise, the masking effect prevents the noise from annoying a listener. Conversely, if audio signals having small amplitudes undergo a high compression ratio, a difference between a signal level and a noise level is reduced. In this case, the masking effect in the reproduced sound cannot be achieved as expected. This causes noticeable dynamic noise. However, if audio signals having small amplitudes undergo a low compression ratio, dynamic noise is reduced to decrease breathing noise.

A compressor in a transmission apparatus according to the present invention is a variable compressor that compresses input signals having large amplitudes at a high compression ratio and input signals having small amplitudes at a low compression ratio, i.e., generates compressed signals through exponential variable compression according to the amplitudes of the input signals. An expander in a reception apparatus is a variable expander that variably expands transferred compressed signals exponentially according to the amplitudes of the compressed signals and generates expanded signals.

The compressor according to the present invention is based on a composite function of a linear function and an exponential function. An output y of the compressor is represented by Expression (1):

$$y = x - B \cdot \exp(Ay) + C \quad (1)$$

where x is the input of the compressor, and A, B, and C are any constant values.

If the levels (amplitudes) of the input signals decrease to cause y to approach $-\infty$, Expression (1) approximates linear Expression (1-1):

$$y = x + C \quad (1\text{-}1)$$

On the other hand, if the levels (amplitudes) of the input signals increase to satisfy the relationship $y \ll B \cdot \exp(Ay)$, Expression (1) approximates Expression (1-2):

$$y = (1/A) \times \ln((x+C)/B) \quad (1\text{-}2)$$

According to Expression (1-2), x approaching $\infty$ leads to logarithmic divergence. This is gradual divergence, and thus the output increases slightly with an increase in the input. Therefore, the compressor functions as a limiter circuit. This characteristic is suitable for a wireless audio system such as a wireless microphone system. This is because the modulation depth of frequency modulation (FM) is regulated by a radio law in each country. The maximum amplitude of an audio signal represents the maximum modulation depth. The compressor according to the present invention functions as a limiter circuit that sets input signals having unexpected large amplitudes at a certain level of amplitude.

The variable compressor and the variable expander used in the present invention are controlled by continuously varying the compression ratio and the expansion ratio on the basis of the exponential function. The compression ratio of the variable compressor and the expansion ratio of the variable expander used in the present invention do not include a bent point as described in the invention in Patent Publication WO2003/030387. Thus, the variable compressor and the variable expander used in the present invention do not involve a conversion error of compression and expansion caused by a difference between bent points of the compressor and the expander.

[Embodiment]

The outline of an embodiment of the analog signal transfer system according to the present invention will be described with reference to FIG. 1. In FIG. 1, analog signals are inputted from an input device 101. The analog signal, for example, audio signals, are inputted from the input device 101 that can be selected among various types of sound source apparatuses such as a microphone that receives and electro-acoustically converts human voice or the sound of a musical instrument and various types of audio apparatuses such as a CD player and a MP3 player. If the input device 101 is a microphone, the example system illustrated in FIG. 1 is a wireless microphone system.

Input signals from the input device 101 are amplified in a pre-emphasis circuit 102 and then outputted to the variable compressor 103. Pre-emphasis is a procedure for amplifying high frequency components of signals before transfer depending on frequency attenuation characteristics in a high frequency range of a transfer path and improving an SN ratio (signal-to-noise ratio) of the transferred signals. At a time constant of 50 μs, the signal amplitude at 15 kHz is 13.6 dB relative to the signal amplitude at 1 kHz. However, the signal amplitude at 15 kHz, 13.6 dB, is normally maintained at any signal amplitude level. Therefore, if the maximum frequency modulation is set at 1 kHz, overmodulation is caused at 15 kHz.

As illustrated in FIG. 1, the pre-emphasis circuit 102 is disposed between the input device 101 and the variable compressor 103. Amplified input signals (amplification signals) are thereby outputted to the variable compressor 103. In this configuration, signals having large amplitudes in a high frequency range are influenced by a limiter circuit while signals having small amplitudes are not influenced by the limiter circuit. This shows that signals having large amplitudes do not undergo pre-emphasis but prevent overmodulation in a signal transfer path, while signals having small amplitudes sufficiently undergo pre-emphasis. Thus, signals having large amplitudes in a high frequency range involve a sacrifice of an SN ratio. In this signal region, "sibilants" are however eliminated effectively. "Sibilants" represent noise caused by sound production of, for example, [s], [z], [ʃ], and [ʒ]. "Sibilants" are generally eliminated by providing a high frequency range limiter circuit. According to the present embodiment, the pre-emphasis circuit 102 is provided to also eliminate "Sibilants" effectively.

The variable compressor 103 compresses the dynamic range of analog audio signals to generate compressed signals. The variable compressor 103 in the present embodiment varies a compression ratio with the signal intensity. The output signal (compressed signal) y to the input signal x of the variable compressor 103 is obtained by Expression (1). The relationship between the input signal x and the output signal y based on Expression (1) is indicated by a solid line 201 in FIG. 2. The variable compressor 103 variably compresses input signals exponentially according to the amplitudes of the input signals, i.e., compresses input signals having large amplitudes at a high compression ratio.

In the solid line 201 curved on the basis of Expression (1), a decrease in the amplitude of the input signal x of the variable compressor 103 causes Expression (1) to approximate Expression (1-1), y=x+C, as described above. An increase in the amplitude of the input signal x of the variable compressor 103 causes Expression (1) to approximate Expression (1-2), $y=(1/A) \times \ln((x+C)/B)$, as described above. A compression ratio CR of the variable compressor 103 is represented by the following expression:

$$CR = 1/(1 + AB \cdot \exp(Ay))$$

The constants A and B are appropriately set to obtain the following expression:

$$1/N = 1/(1 + AB \cdot \exp(A \cdot y_{max}))$$

where $y_{max}$ is the maximum output signal of the variable compressor 103. The variable compressor 103 varies the compression ratio from 1:1 to 1:N.

In FIG. 1, audio signals (compressed signals) generated in the variable compressor 103 are modulated in a transmitter 104 and then transmitted from an antenna 105. The transmitter 104 frequency-modulates audio signals with RF signals (high frequency signals). The frequency-modulated RF signals are emitted from the antenna 105 serving as a load for the transmitter 104 to a wireless transfer path 106. The modulation in the transmitter 104 may be of any type other than the frequency modulation. The units from the input device 101 to the antenna 105 are collectively referred to as a transmission apparatus 400 for signals. In FIG. 1, the system for transferring signals from the transmission apparatus 400 to a reception apparatus 500 corresponds to the wireless transfer path 106 transferring electromagnetic waves. The system can however be implemented by any transfer method selected from a simple wired transfer line, an infrared wireless line, and other transfer systems.

Signals converted into electromagnetic waves in the antenna 105 are emitted to the wireless transfer path 106. The electromagnetic waves are captured by an antenna 107 of the reception apparatus 500 and then converted into electric signals by the antenna 107. The electric signals, which are weak, are RF-amplified in a receiver 108. The RF signals are then FM-detected to obtain demodulated analog audio signals. The demodulated audio signals are amplified at an appropriate signal level and then inputted to the variable expander 109.

The variable expander 109 expands the dynamic range of audio signals to generate expanded signals. The variable expander 109 in the present embodiment variably expands compressed signals that are compressed by the variable compressor 103 and transferred through the transfer path, exponentially according to the amplitudes of the signals, and generates expanded signals. In other words, the variable expander 109 is implemented as an inverse function circuit of the variable compressor 103. The output y to the input x of the variable expander 109 is represented by a curved solid line 301 in FIG. 3. The curved solid line 301 corresponds to the following expression (2):

$$y = x + B \cdot \exp(Ax) - C \quad (2)$$

If the amplitude of the input signal x to the variable expander 109 decreases, Expression (2) approximates Expression (2-1):

$$y = x - C \quad (2\text{-}1)$$

On the other hand, if the amplitude of the input signal x to the variable expander 109 increases, Expression (2) approximates Expression (2-2):

$$y = B \cdot \exp(Ax) - C \quad (2\text{-}2)$$

Expression (2-2) is represented by Expression (2-3):

$$ER = 1 + AB \cdot \exp(Ax) \quad (2\text{-}3)$$

where ER is the expansion ratio of the variable expander 109.

The constants A and B are appropriately set to deform Expression (2-3) into Expression (2-4):

$$N = 1 + AB \cdot \exp(Ax\max) \quad (2\text{-}4)$$

where xmax is the maximum input signal of the variable expander 109.

The variable expander 109 expands signals by varying the expansion ratio from 1:1 to N:1.

The audio signals expanded in the variable expander 109 (expanded signals) are corrected by and then outputted from a de-emphasis circuit 110 that decreases the levels of the high frequency region generated by amplification of the pre-emphasis circuit 102 to the original amplitude levels. The de-emphasis circuit 110 is therefore set so as to implement an inverse function of the pre-emphasis circuit 102.

The audio signals from the de-emphasis circuit 110 (corrected signals) are inputted to an output device 111. The output device 111 is an audio apparatus such as a speaker, or an interface for outputting to an audio apparatus such as a mixing console, a recording medium, or a drive device for a recording medium. In the present embodiment, the units from the antenna 107 to the output device 111 are collectively referred to as the reception apparatus 500.

Figure 2:
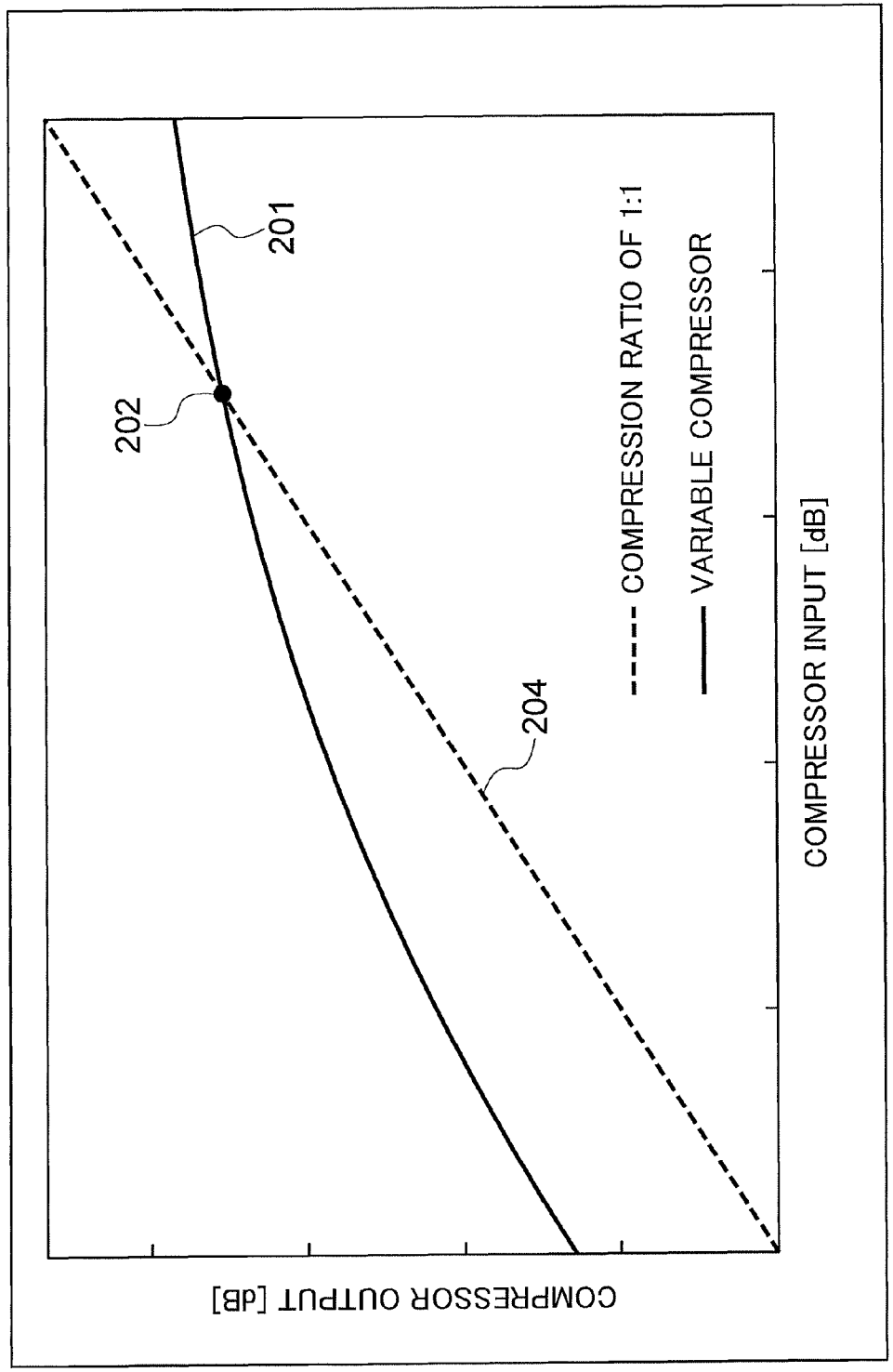
FIG. 2 is a graph illustrating the relationship between input signals and output signals of a variable compressor in the embodiment in comparison with the case of a constant compression ratio of 1:1.

Input/output characteristics of the variable compressor 103 illustrated in FIG. 2 will be described further. The input and output levels are represented in units of dB (decibels). A dotted line 204 indicates characteristics of a compressor having a compression ratio of 1:1 and is therefore a straight line. The curved line 201 indicating input/output characteristics of the variable compressor 103 intersects at one intersection point 202 with the straight line 204 indicating input/output characteristics at a compression ratio of 1:1. At the intersection point 202, the amplitude levels of signals do not vary in a signal transfer system from the variable compressor 103 to the variable expander 109. In other words, the amplitude levels of signals do not attenuate or increase at the intersection point 202.

At a compressor input higher than the input at the intersection point 202 on the curved line 201, the output on the curved line 201 is lower than the output on the straight line 204 indicating input/output characteristics at a compression ratio of 1:1. At this time, the variable compressor 103 attenuates the amplitudes of input signals to generate compressed signals.

On the other hand, at a compressor input lower than the input at the intersection point 202 on the curved line 201, the variable compressor 103 amplifies the amplitudes of input signals to generate compressed signals. As described above, in the region where the input signal level is higher than that at the intersection point 202, the compressor output gradually increases on a gentle curved line. This shows that signals having large amplitudes are inputted to limit the amplitudes of outputted compressed signals. On the other hand, as an input signal level decreases below the input at the intersection point 202 on the curved line 201, the slope of the curved line 201 approaches the slope of the straight line 204 plotted at a compression ratio of 1:1. This can cause the variable compressor 103 to effectively reduce breathing noise as described above.

Input/output characteristics of the variable expander 109 illustrated in FIG. 3 will now be described. The input and output levels are represented in units of dB (decibels). A dotted line 304 corresponds to an expander having an expansion ratio of 1:1 and is therefore a straight line. The curved solid line 301 indicates input/output characteristics of the variable expander 109 and is represented by an inverse function with respect to input/output characteristics of the variable compressor 103. If FIGS. 2 and 3 are laid one on top of another, the straight line 204 coincides with the straight line 304, and the curved line 201 indicating input/output characteristics of the variable compressor 103 is symmetric to the curved line 301 indicating input/output characteristics of the variable expander 109 about the straight lines 204 and 304.

Figure 3:
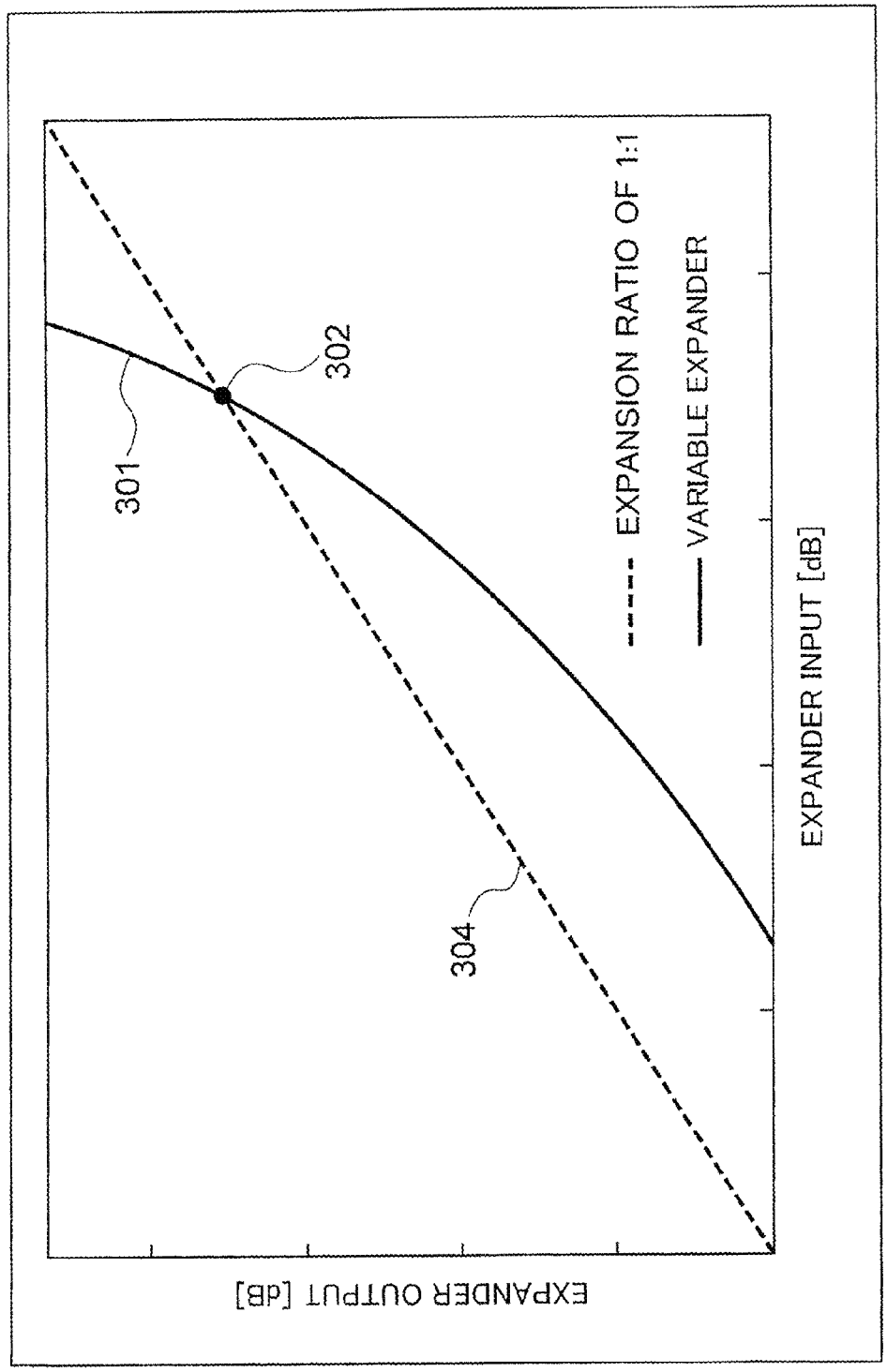
FIG. 3 is a graph illustrating the relationship between input signals and output signals of a variable expander in the embodiment in comparison with the case of an expansion ratio of 1:1.

In FIG. 3, the curved line 301 intersects with the straight line 304 at an intersection point 302. At the intersection point 302, the amplitude levels of signals do not vary in a signal transfer system from the variable compressor 103 to the variable expander 109. In other words, the amplitude levels of signals do not attenuate or increase at the intersection point 302. At an expander input higher than the input at the intersection point 302 on the curved line 301, the variable expander 109 exponentially increases the amplitudes of inputted compressed signals to generate expanded signals. On the other hand, at an expander input lower than the input at the intersection point 302 on the curved line 301, the variable expander 109 attenuates the amplitudes of inputted compressed signals to generate expanded signals. As described above, the variable expander 109 variably expands transferred signals exponentially according to the amplitudes of the compressed signals and generates expanded signals, so as to expand the dynamic range of the transferred signals on one side of the intersection point 302 and attenuates the dynamic range on the other side.

Figure 4:
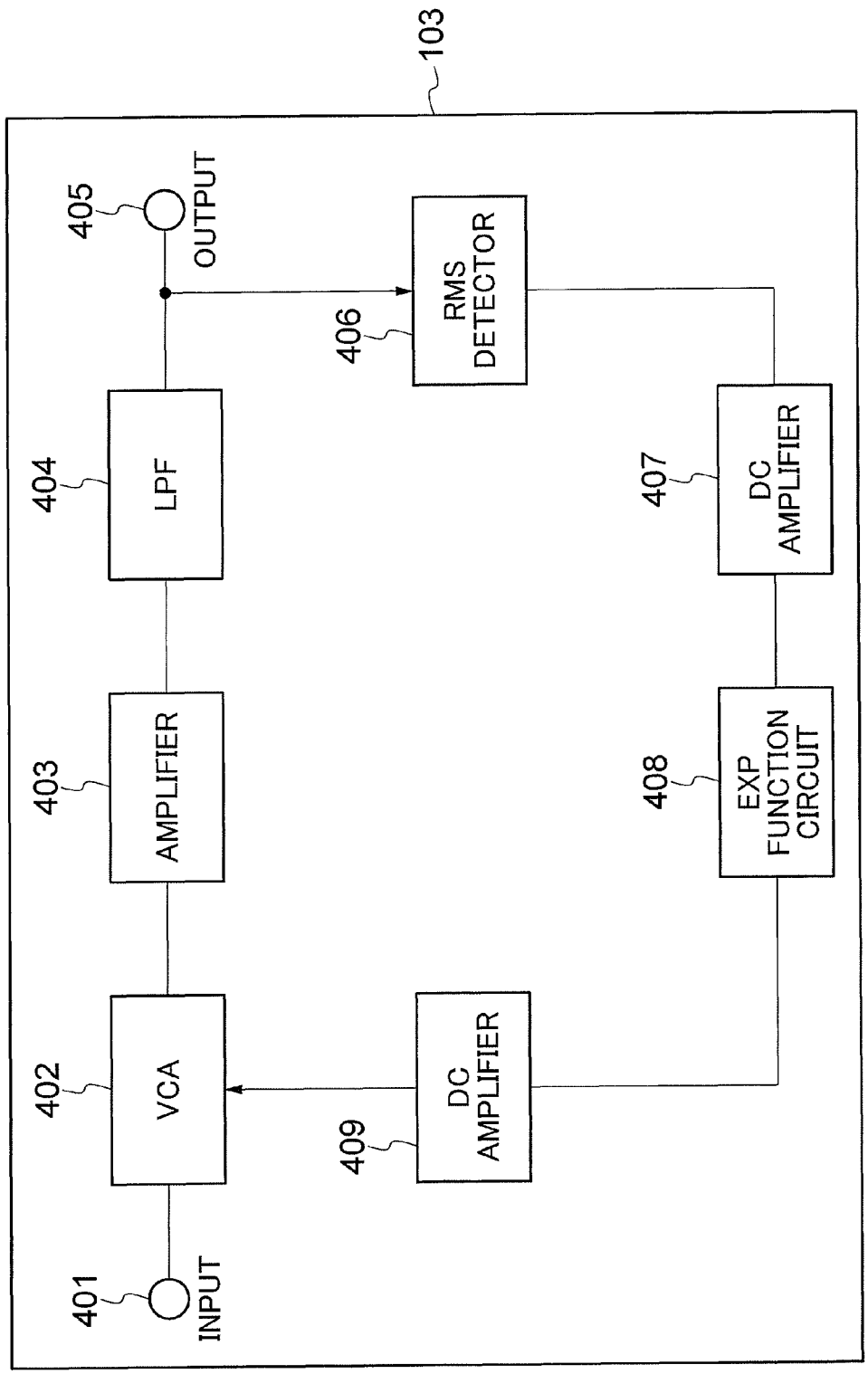
FIG. 4 is a block diagram illustrating the configuration of the variable compressor in the embodiment.

The internal configuration of the variable compressor 103 will now be described with reference to FIG. 4. In FIG. 4, audio signals inputted from an input terminal 401 pass through a voltage control amplifier (hereinafter referred to as "VCA") 402, an amplifier 403, and a low-pass filter (LPF) 404, and then are outputted from an output terminal 405. Output signals from the low-pass filter 404 pass through an RMS detector 406, a direct current (DC) amplifier 407, an EXP function circuit 408, and a DC amplifier 409, and then fed back into the VCA 402. Thus, the variable compressor 103 amplifies audio signals inputted from the input terminal 401 with the amplifier 403 and the VCA 402 controlled by a feedback control voltage.

The VCA 402 controls its gain according to fed-back signals. The amplifier 403 has static gain determined by a constant C1 that is set appropriately. The low-pass filter 404 eliminates high frequency components unnecessary for audio signals. Signals outputted from the low-pass filter 404 are outputted to both the output terminal 405 and the RMS detector 406. RMS represents root mean square, i.e., the square root of the arithmetical average of the squares of original values. The RMS detector 406 detects the effective value of audio signals and converts the effective value into a direct current logarithmic voltage.

The DC amplifier 407 inverts the polarity of the voltage detected by the RMS detector 406 and amplifies the voltage to a value represented by a predetermined constant A. The EXP function circuit 408 controlling the exponential function converts the output of the DC amplifier 407 into a value of an exponential function and amplifies the value to a value represented by a predetermined constant B.

The DC amplifier 409 inverts the polarities of output signals from the EXP function circuit 408 and adds a value represented by a predetermined constant C2 to the inverted output signals from the EXP function circuit 408. The sum of the predetermined constants C1 and C2 is equal to a predetermined constant C.

Figure 5:
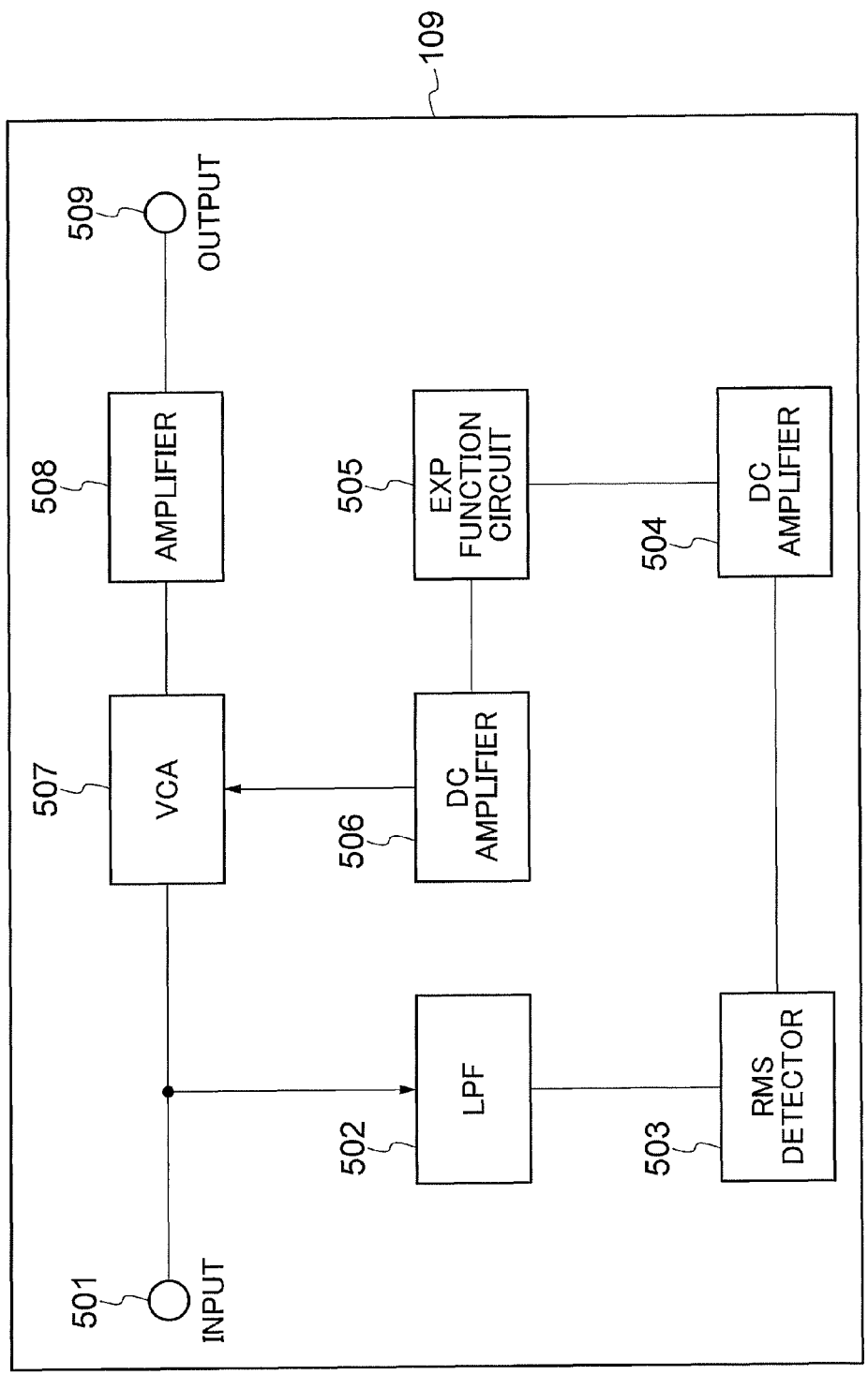
FIG. 5 is a block diagram illustrating the configuration of the variable expander in the embodiment.

FIG. 5 illustrates the internal configuration of the variable expander 109. In FIG. 5, audio signals inputted from an input terminal 501 are outputted from an output terminal 509 through a VCA 507 and an amplifier 508 and variably expanded by a feedforward signal generated by a feedforward circuit described below to generate expanded signals. The feedforward circuit is used to utilize a feedback circuit in the variable compressor 103 of the transmission apparatus 400 without modification.

Audio signals received and demodulated in the receiver 108 are inputted through the input terminal 501 to the VCA 507 and a low-pass filter 502. The low-pass filter 502 eliminates high frequency components unnecessary for audio signals. An output from the low-pass filter 502 is inputted to an RMS detector 503. The RMS detector 503 detects the effective value of audio signals and converts the effective value into a direct current logarithmic voltage. Output signals of the RMS detector 503 are inputted to a DC amplifier 504. The DC amplifier 504 inverts the polarities of output signals from the RMS detector 503 and amplifies the output signals to a value represented by the predetermined constant A to input the resultant signals to an EXP function circuit 505. The EXP function circuit 505 controlling the exponential function converts output signals of the DC amplifier 504 into values of the exponential function and amplifies the values to a value represented by the predetermined constant B.

Output signals of the EXP function circuit 505 are inputted to a DC amplifier 506. The DC amplifier 506 has a configuration different from that of the DC amplifier 409 in the variable compressor 103. In detail, the DC amplifier 506 inputs output signals from the EXP function circuit 505 to the VCA 507 without inverting the polarities of the signals. The DC amplifier 506 also subtracts a value represented by the predetermined constant C2 from the output of the EXP function circuit 505 and outputs the resultant value. The VCA 507, whose gain is controlled by a control voltage inputted from the DC amplifier 506, amplifies signals inputted from the input terminal 501 with the gain and inputs the signals to the amplifier 508. The static gain of the amplifier 508 determines the predetermined constant C1. The sum of the constants C1 and C2 is equal to the predetermined constant C. The output of the amplifier 508 is outputted from the output terminal 509 as the output of the variable expander 109.

Figure 6:
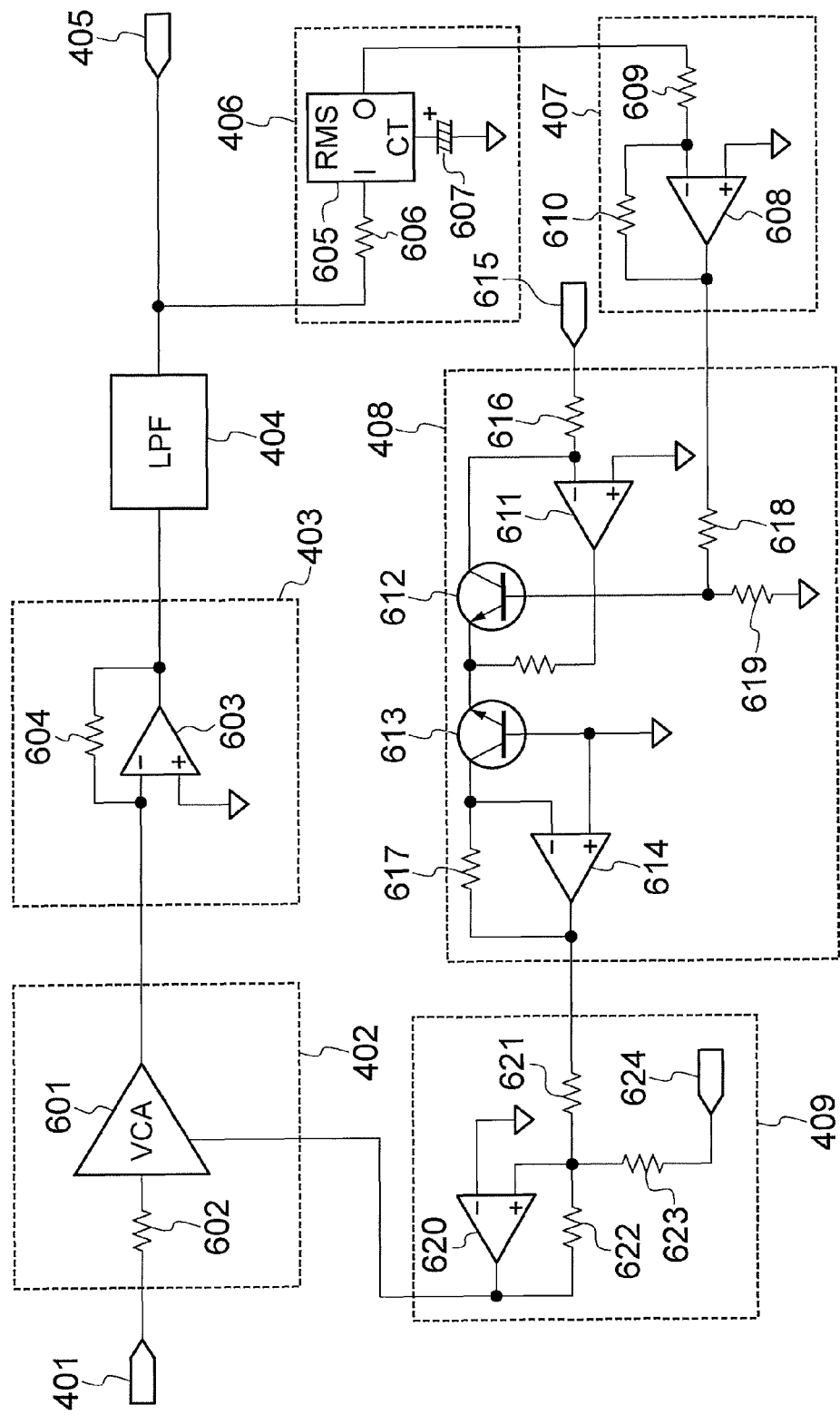
FIG. 6 is a circuit diagram illustrating the more detailed configuration of the variable compressor in the embodiment.

FIG. 6 illustrates the detail of an example circuit of the variable compressor 103. Blocks surrounded by dashed lines in FIG. 6 correspond to the respective blocks in FIG. 4. The blocks and elements common to FIGS. 4 and 6 are denoted by the same reference numerals. The VCA 402 includes an integrated circuit 601 as a main element while the RMS detector 406 includes an integrated circuit 605 as a main element. These circuits are composed of THAT4320 produced by THAT Corporation. Audio signals inputted to the input terminal 401 are amplified by the amplifier 403 and the VCA 402 controlled by a feedback control voltage from the feedback control circuit.

The amplifier 403 includes an operational amplifier 603 as a main element and functions as an inverting amplifier. The predetermined constant C1 representing the static gain is determined by the following expression:

$$C1 = R604/R602$$

where R602 is the value of an input resistor 602 for the integrated circuit 601 in the VCA 402, and R604 is the value of a feedback resister 604 for the operational amplifier 603. The low-pass filter 404 connected to a stage subsequent to the amplifier 403 eliminates signals above 22 kHz, i.e., outside the frequency band.

The RMS detector 406 converts the effective value of detected audio signals into a direct current voltage. The integrated circuit 605 in the RMS detector 406 converts a voltage detected at an input resistor 606 into a logarithmic voltage. The conversion expression is as follows:

$$Vrms = 0.006 \times (y - D)$$

where Vrms is a conversion voltage, D is a predetermined constant (dB) determined by the value of the input resistor 606 and the integrated circuit 605. The time constant of the integrated circuit 605 is determined by the capacitance of a capacitor 607 connected to the integrated circuit 605. In the case where an audio frequency band is processed, the time constant is set to about 32 ms.

The DC amplifier 407 is an inverting amplifier including an operational amplifier 608 as a main element. A predetermined constant A' representing the amplification factor of the DC amplifier 407 is determined by the following expression:

$$A' = R610/R609$$

where R609 is the value of an input resistor 609 for the operational amplifier 608, and R610 is the value of a feedback resister 610.

The EXP function circuit 408 operates in accordance with the following expression:

$$Vo = B' \cdot \exp(-Vi)$$

The EXP function circuit 408 uses exponential characteristics of a transistor. Characteristics of a transistor vary with temperature variations. In order to correct a variation in the characteristics, two transistors 612 and 613 having similar characteristics are coupled thermally. The EXP function circuit 408 includes an operational amplifier 611 on its input side. The operational amplifier 611 constitutes a voltage shifting circuit dependent on temperature compensation. The EXP function circuit 408 includes an operational amplifier 614 on its output side. The operational amplifier 614 constitutes a basic circuit of the EXP function circuit 408.

The predetermined constant B' is determined by the following expression:

$$B' = (R617/R616) \times Vb$$

where R616 is the value of an input resistor 616 for the operational amplifier 611, 8617 is the value of a feedback resister 617 for the operational amplifier 614, and Vb is a voltage 615 applied to the input resistor 616. Output signals from the DC amplifier 407 are inputted through a resistor 618 to the base of the transistor 612 in the EXP function circuit 408. An appropriate voltage is applied to the base of the transistor 612 through a resistor 619. The resistors 618 and 619 provide partial resistance for correcting a physical constant.

The DC amplifier 409 is a circuit to add output signals from the EXP function circuit 408 to a voltage corresponding to a gain at a predetermined constant C2'. Output signals from the EXP function circuit 408 are inputted through a resistor 621 to the non-inverting input terminal of an operational amplifier 620 in the DC amplifier 409. A voltage is applied from a voltage source 624 through a resistor 623 to the non-inverting input terminal of the operational amplifier 620. The predetermined constant C2' is determined by the following expression:

$$C2' = (R622/R623) \cdot Vc$$

where R622 is the value of a resister 622, R623 is the value of a resister 623, and Vc is the voltage of the voltage source 624.

The integrated circuit 601 in the VCA 402 is controlled by output signals from the DC amplifier 409. A voltage constant for control on the integrated circuit 601 exerted by the DC amplifier 409 is determined as 0.006/dB.

Figure 7:
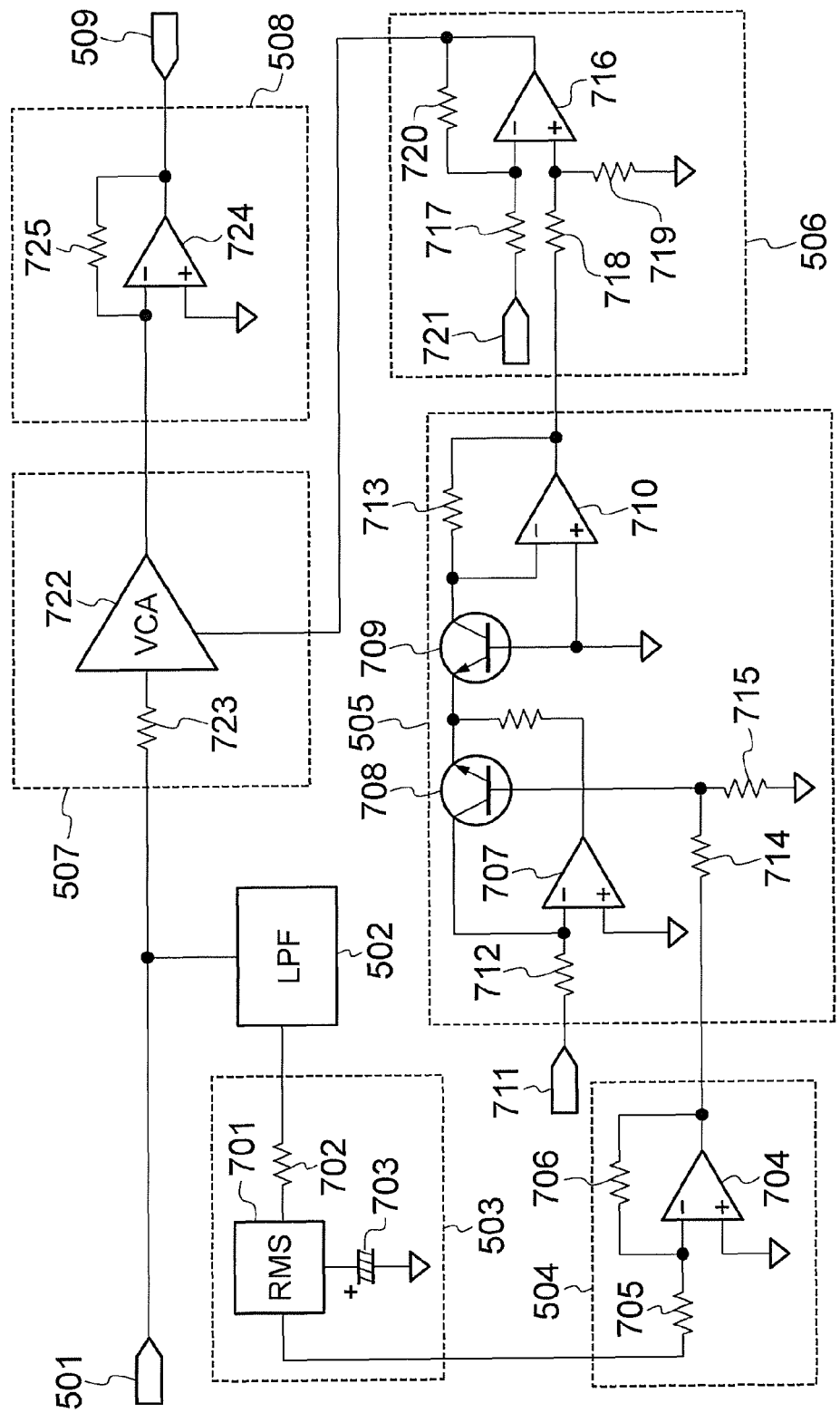
FIG. 7 is a circuit diagram illustrating the more detailed configuration of the variable expander in the embodiment.

The detail of an example circuit of the variable expander will now be described with reference to FIG. 7. In FIG. 7, a low-pass filter 502, an RMS detector 503, a DC amplifier 504, and an EXP function circuit 505 have the same configurations as the low-pass filter 404, the RMS detector 406, the DC amplifier 407, and the EXP function circuit 408 in the variable compressor, respectively. Audio signals received and demodulated in the receiver 108 are inputted through the input terminal 501 to both the low-pass filter 502 and the VCA 507. The low-pass filter 502 eliminates signals above 22 kHz, i.e., outside the frequency band and inputs the resultant signals to the RMS detector 503.

The RMS detector 503 converts the detected effective value of audio signals into a direct current logarithmic voltage. The conversion expression is as follows:

$$Vrms = 0.006 \times (x - D)$$

A predetermined constant D is determined by an integrated circuit 701 and the value of a resistor 702. The time constant of the integrated circuit 701 is determined by the value of a capacitor 703 connected to the integrated circuit 701.

The DC amplifier 504 is an inverting amplifier including an operational amplifier 704 as a main element. A predetermined constant A' representing the amplification factor of the operational amplifier 704 is determined by the following expression:

$$A' = R706/R705$$

where R705 is the value of an input resistor 705 for the operational amplifier 704, and R706 is the value of a feedback resister 706.

An output Vo from the EXP function circuit 505 is represented by the following expression:

$$Vo = B' \cdot \exp(-Vi)$$

In the EXP function circuit 505, two transistors 708 and 709 having similar characteristics are connected in series in order to compensate temperature. The EXP function circuit 505 also includes two operational amplifiers 707 and 710. The operational amplifier 707 is a voltage shifting circuit dependent on temperature compensation. The operational amplifier 710 connected to the output side of the EXP function circuit 505 is a basic circuit of the EXP function circuit.

A voltage is applied from a voltage source 711 through a resistor 712 to the inverting input terminal of the operational amplifier 707. The value of the resistor 712 is referred to as R712, and a voltage of the voltage source 711 is referred to as Vb. The other operational amplifier 710 is connected between the transistor 709 and the output end of the EXP function circuit 505. The value of a feedback resistor 713 for the operational amplifier 710 is referred to as R713. A predetermined constant B' for the EXP function circuit 505 is determined by the following expression:

$$B' = (R713/R712) \cdot Vb$$

Output signals from the DC amplifier 504 are inputted through a resistor 714 to the base of the transistor 708 in the EXP function circuit 505. An appropriate voltage is applied to the base of the transistor 708 through a resistor 715. The resistors 714 and 715 provide partial resistance for correcting a physical constant.

The DC amplifier 506 subtracts a voltage equivalent to gain represented by the predetermined constant C2' from the output of the EXP function circuit 505. Output signals from the EXP function circuit 505 are inputted through a resistor 718 to the non-inverting input terminal of an operational amplifier 716 in the DC amplifier 506. A voltage is applied from an appropriate voltage source through a resistor 719 to the non-inverting input terminal of the operational amplifier 716. A voltage is applied from a voltage source 721 through a resistor 717 to the inverting input terminal of the operational amplifier 716. A feedback resistor 720 is connected between the output terminal and the inverting input terminal of the operational amplifier 716.

The output Vo of the DC amplifier 506 is expressed as follows:

$$Vo = Vi - (R720/R719) \cdot Vc = Vi - C2'$$

where R717 is the value of the resistor 717, R718 is the value of the resistor 718, R719 is the value of the resistor 719, R720 is the value of the feedback resister 720, Vc is the voltage of the voltage source 721, R720 is equal to R718, and R719 is equal to R717.

The predetermined constant C2' is determined by the following expression:

$$C2'=(R720/R719) \cdot Vc$$

The integrated circuit 722 in the VCA 507 is controlled by output signals from the DC amplifier 506. A voltage constant for control on the integrated circuit 722 exerted by the DC amplifier 506 is determined as 0.006/dB.

Audio signals from the input terminal 501 are inputted to the integrated circuit 722 in the VCA 507 through a resistor 723. The resistor 723 and a feedback resistor 725 for an operational amplifier 724 that is the main component of the amplifier 508 are arranged such that the operational amplifier 724 functions as an inverting amplifier. The predetermined constant C1 representing the total static gain of the VCA 507 and the amplifier 508 is determined by the following expression:

$$C1 = R725/R723$$

where R723 is the value of the resistor 723, and R725 is the value of the feedback resister 725.

An analog signal transfer system according to the present invention includes the variable compressor 103 that variably compresses signals inputted to the transmission apparatus 400 exponentially according to the amplitudes of the input signals and the variable expander 109 that variably expands signals transferred to the reception apparatus 500 exponentially according to the amplitudes of the transferred signals.

This configuration according to the present invention can reduce inflow of noise from a noise source through the transfer path.

Additionally, since the present invention does not use the bent points causing a stepwise variation, breathing noise can effectively be reduced without causing noise or abnormal sound.

What is claimed is:

1. An analog signal transfer system comprising:
    a transmission apparatus including a variable compressor that continuously and variably compresses input signals exponentially according to amplitudes of the input signals and generates compressed signals, wherein
    an output y of the variable compressor is represented according to a formula, $$y = x - B \cdot \exp(Ay) + C, \text{ and}$$

the compression ratio, CR, of the variable compressor is represented according to a formula, $$CR = 1/(1 + AB \cdot \exp(Ay)); \text{ and}$$

a reception apparatus including a variable expander that continuously and variably expands the compressed signals exponentially according to amplitudes of the compressed signals and generates expanded signals, wherein
    an output y' of the variable expander is represented according to a formula, $$y' = x' + B \cdot \exp(Ax') - C, \text{ and}$$

the expansion ratio, ER, of the variable expander is represented according to a formula, $$ER = 1 + AB \cdot \exp(Ax');$$

wherein x is the input of the variable compressor, x' is the input of the variable expander, and A, B, and C are any constant values.

2. The analog signal transfer system according to claim 1, wherein the
    transmission apparatus includes:
    an input device receiving the input signals; and
    a pre-emphasis circuit that amplifies the input signals to output the amplified input signals to the variable compressor, and
    the reception apparatus includes:
    a de-emphasis circuit that corrects the expanded signals.

3. The analog signal transfer system according to claim 1, wherein the variable compressor variably compresses the input signals by feedback control.

4. The analog signal transfer system according to claim 1, wherein the variable expander variably expands the compressed signals by feedforward control.

5. The analog signal transfer system according to claim 1, wherein
    the variable compressor variably compresses the input signals by continuously varying the compression ratio, CR, from 1:1 to 1:N exponentially according to the amplitudes of the input signals, and
    the variable expander variably expands the compressed signals by continuously varying the expansion ratio, ER, from 1:N to 1:1 exponentially according to the amplitudes of the compressed signals.

6. The analog signal transfer system according to claim 1, wherein
    the variable compressor attenuates the amplitude of the input signals having amplitudes larger than a predetermined value and generates the compressed signals,
    the variable expander amplifies the amplitude of the compressed signals having amplitudes larger than a predetermined value and generates the expanded signals.

7. A variable compressor that continuously and variably compresses input signals exponentially according to the amplitudes of the input signals and generates compressed signals, wherein
    an output y of the variable compressor is represented according to a formula, $$y = x - B \cdot \exp(Ay) + C, \text{ and}$$

the compression ratio, CR, of the variable compressor is represented according to a formula, $$CR = 1/(1 + AB \cdot \exp(Ay));$$

wherein x is the input of the variable compressor, and A, B, and C are any constant values, the variable compressor comprising:
    a voltage control amplifier that amplifies the input signals according to a control voltage and outputs the amplified signals;
    an RMS detector that calculates root mean square of the outputted signals to obtain effective values of the outputted signals; and
    an EXP function circuit that converts the effective values of the outputted signals from the RMS detector into values of an exponential function and provides the converted values as the control voltage for the voltage control amplifier.

8. The variable compressor according to claim 7, further comprising a low-pass filter that receives output signals from the voltage control amplifier, wherein
    the output signals from the low-pass filter function as the compressed signals, and the control voltage for the voltage control amplifier is controlled according to the output signals from the low-pass filter through the RMS detector and the EXP function circuit.

9. A variable expander that continuously and variably expands compressed signals exponentially according to the amplitudes of the compressed signals and generates expanded signals, wherein an output y' of the variable expander is represented according to a formula, $$y'=x'+B \cdot exp(Ax')-C, \text{ and}$$

the expansion ratio, ER, of the variable expander is represented according to a formula, $$ER=1+AB \cdot exp(Ax');$$

wherein x' is the input of the variable expander, and A, B, and C are any constant values, the variable expander comprising:

a voltage control amplifier that amplifies the compressed signals according to a control voltage and outputs the amplified signals;

an RMS detector that calculates root mean square of the compressed signals to obtain effective values of the outputted signals; and an EXP function circuit that converts the effective values of the outputted signals from the RMS detector into values of an exponential function and provides the converted values as the control voltage for the voltage control amplifier.

10. The variable expander according to claim 9, wherein the compressed signals are inputted to the voltage control amplifier and a low-pass filter, output signals from the low-pass filter function as the expanded signals, and a control voltage for the voltage control amplifier is controlled according to the output signals from the low-pass filter through the RMS detector and the EXP function circuit.

\* \* \* \* \*